(12) United States Patent
Einsla et al.

(10) Patent No.: US 8,211,734 B2
(45) Date of Patent: Jul. 3, 2012

(54) METHOD FOR PRODUCING A PHOTOVOLTAIC MODULE

(75) Inventors: Melinda L. Einsla, Chalfont, PA (US); Edward C. Greer, Lower Gwynedd, PA (US); Hailan Guo, Warrington, PA (US)

(73) Assignee: Rohm and Haas Company, Philadelphia, PA (US)

(*) Notice: Subject to any disclaimer, the term of this patent is extended or adjusted under 35 U.S.C. 154(b) by 45 days.

(21) Appl. No.: 13/004,122

(22) Filed: Jan. 11, 2011

(65) Prior Publication Data

US 2011/0171771 A1 Jul. 14, 2011

Related U.S. Application Data

(60) Provisional application No. 61/335,808, filed on Jan. 12, 2010.

(51) Int. Cl.
*H01L 21/00* (2006.01)

(52) U.S. Cl. ........ 438/64; 438/66; 257/E21.09; 257/E31.117; 428/214

(58) Field of Classification Search ............... 438/64, 438/66; 257/E21.09, E31.117; 428/214
See application file for complete search history.

(56) References Cited

U.S. PATENT DOCUMENTS

| | | | |
|---|---|---|---|
| 5,776,364 A * | 7/1998 | Niiyama et al. | 252/299.01 |
| 2004/0144420 A1 | 7/2004 | Takeyama et al. | |
| 2005/0065310 A1 * | 3/2005 | Wang et al. | 528/44 |
| 2005/0123781 A1 | 6/2005 | Drescher et al. | |
| 2006/0207646 A1 | 9/2006 | Terreau et al. | |
| 2008/0290324 A1 * | 11/2008 | Louwet et al. | 252/500 |
| 2009/0069465 A1 | 3/2009 | Austrup et al. | |
| 2010/0229945 A1 | 9/2010 | Suzuta et al. | |

FOREIGN PATENT DOCUMENTS

| | | |
|---|---|---|
| JP | 60255861 | 12/1985 |
| JP | 4106118 | 4/1992 |
| JP | 7010957 | 2/1995 |
| JP | 1998017640 | 1/1998 |
| JP | 2001114858 | 2/2001 |
| JP | 2004067958 | 3/2004 |
| WO | 0118071 | 1/2001 |
| WO | 2010101811 | 9/2010 |

OTHER PUBLICATIONS

Takenaka, et al., "Low-cost amorphous silicon photovoltaic module encapsulated with liquid resin", Solar Energy Materials and Solar Cells, vol. 49, pp. 127-133, (1997).

Kapoor, et al., "Fabrication and characterization of polyester and acrylic polyurethane optical waveguides", Applied Optics, vol. 28, No. 1, pp. 37-39, (1989).

* cited by examiner

*Primary Examiner* — Olik Chaudhuri
*Assistant Examiner* — Wilner Jean Baptiste
(74) *Attorney, Agent, or Firm* — Kenneth Crimaldi

(57) ABSTRACT

A method for producing a photovoltaic module by forming solar cells on a glass plate and contacting at least one layer of liquid encapsulant with the solar cells. The liquid encapsulant has two components. The first component is an acrylic polyol having an average number of hydroxy-functional monomer units per polymer chain from 2 to 25 and Mn from 1,000 to 10,000. The second component is a polyisocyanate with an average functionality of at least two. The molar ratio of non-terminal hydroxy groups in the polyol to isocyanate groups in the polyisocyanate is from 0.5:1 to 1:0.5.

8 Claims, No Drawings

METHOD FOR PRODUCING A PHOTOVOLTAIC MODULE

This application claims the benefit of priority under 35 U.S.C. §119(e) of U.S. Provisional Patent Application No. 61/335,808 filed on Jan. 12, 2010.

This invention relates to a liquid encapsulant particularly useful for construction of photovoltaic modules and to a process for producing a photovoltaic module.

Methods have been disclosed for encapsulation of solar cells into a photovoltaic module. For example, U.S. Pub. No. 2006/0207646 discloses a process using a liquid silicone encapsulant. However, use of acrylic-urethane resins for this purpose has not been reported.

The problem addressed by the present invention is to provide a liquid encapsulant particularly useful for construction of photovoltaic modules and a process for producing a photovoltaic module.

STATEMENT OF INVENTION

The present invention provides a method for producing a photovoltaic module comprising steps of: (a) forming solar cells on a glass plate; and (b) contacting at least one layer of liquid encapsulant with said solar cells; wherein the liquid encapsulant comprises: (i) an acrylic polyol having an average number of hydroxy-functional monomer units per polymer chain from 2 to 25 and Mn from 1,000 to 10,000; and (ii) a polyisocyanate with an average functionality of at least two; wherein a molar ratio of non-terminal hydroxy groups in the polyol to isocyanate groups in the polyisocyanate is from 0.5:1 to 1:0.5.

DETAILED DESCRIPTION

Percentages are weight percentages (wt %) and temperatures are in ° C., unless specified otherwise. Weight percentages of monomers are based on the total weight of monomers in the polymerization mixture. As used herein the term "(meth)acrylic" refers to acrylic or methacrylic, and "(meth)acrylate" refers to acrylate or methacrylate. The term "(meth)acrylamide" refers to acrylamide (AM) or methacrylamide (MAM). "Acrylic monomers" include acrylic acid (AA), methacrylic acid (MAA), esters of AA and MAA, itaconic acid (IA), crotonic acid (CA), acrylamide (AM), methacrylamide (MAM), and derivatives of AM and MAM, e.g., alkyl (meth)acrylamides. Esters of AA and MAA include, but are not limited to, alkyl, hydroxyalkyl, phosphoalkyl and sulfoalkyl esters, e.g., methyl methacrylate (MMA), ethyl methacrylate (EMA), butyl methacrylate (BMA), hydroxyethyl methacrylate (HEMA), hydroxyethyl acrylate (HEA), hydroxypropyl methacrylate (HPMA), hydroxybutyl acrylate (HBA), methyl acrylate (MA), ethyl acrylate (EA), butyl acrylate (BA), 2-ethylhexyl acrylate (EHA) and phosphoalkyl methacrylates (e.g., PEM).

The term "vinyl monomers" refers to monomers that contain a carbon-carbon double bond that is connected to a heteroatom such as nitrogen or oxygen. Examples of vinyl monomers include, but are not limited to, vinyl acetate, vinyl formamide, vinyl acetamide, vinyl pyrrolidone, vinyl caprolactam, and long chain vinyl alkanoates such as vinyl neodecanoate, and vinyl stearate.

A solar cell is a semiconductor used to generate electricity from light. Solar cells typically are made from semiconductor materials such as silicon (crystalline, polycrystalline or thin film), gallium arsenide, copper indium diselenide, cadmium telluride, copper indium gallium diselenide, and mixtures thereof. Solar cells may be in the form of wafers or thin films, the former being made by cutting from a crystal or casting and the latter deposited on a substrate or superstrate by sputtering or chemical vapor deposition (CVD).

In some embodiments of the invention, the acrylic polyol has a hydroxy end group. The average number of hydroxy-functional monomer units per polymer chain is an average value calculated for the acrylic polyol from its values of Mn and equivalent weight (EW) (units/chain=Mn/EW). The equivalent weight is defined as the mass of polyol which contains one mole of hydroxyl functionality, excluding hydroxy end groups. For example, a polyol containing 15wt % HEMA has EW=876.6 g polyol/mole OH. If the hydroxyl number (OH#) has been determined for the polyol, then the calculation is as follows: Mn/(56105/OH#). The hydroxyl number is calculated from the hydroxy-functional monomer content of the polymer, without including the hydroxy end group believed to be derived from the chain transfer agent. OH#=56105/EW. The actual distribution of polymer chains will of course contain some chains with lower and higher hydroxyl functionality. In some embodiments of the invention, the average hydroxyl functionality per polymer chain is at least 2.5, preferably at least 3, preferably at least 3.5, preferably at least 4; the average hydroxyl functionality is no greater than 10, preferably no greater than 8, preferably no greater than 7, preferably no greater than 6.

In some embodiments of the invention, Mn of the acrylic polyol is a least 2,000, preferably at least 2,500, preferably at least 3,000, preferably at least 3,500. In some embodiments of the invention, Mn of the acrylic polyol is no greater than 8,000, preferably no greater than 7,000, preferably no greater than 6,000. In some embodiments Mw/Mn is from 1.5 to 3.5, alternatively from 2 to 3. In some embodiments of the invention, the Tg of the acrylic polyol is from −100° C. to −40° C., preferably from −80° C. to −45° C., preferably from −75° C. to −50° C.

In some embodiments of the invention, the acrylic polyol comprises at least 60% polymerized residues of acrylic monomers, preferably at least 70%, preferably at least 80%, preferably at least 90%, preferably at least 95%. In some embodiments of the invention, the acrylic polyol contains from 5 to 35% polymerized residues of hydroxy-containing acrylic monomers, preferably from 8 to 25%, preferably from 10 to 20%. In some embodiments of the invention, the acrylic polyol has Mn from 3,000 to 5,000 and from 10 to 20% residues of hydroxy-containing acrylic monomers. In some embodiments, hydroxy-containing monomers are hydroxyalkyl (meth)acrylates, preferably those selected from HEMA, HPMA, HBA or combinations thereof; preferably HEMA and/or HPMA. In some embodiments, the acrylic polyol comprises from 65 to 95% polymerized residues of $C_4$-$C_{12}$ alkyl (meth)acrylate(s), preferably from 75 to 92%, preferably from 80 to 90%; in some embodiments, the $C_4$-$C_{12}$ alkyl (meth)acrylate(s) are $C_4$-$C_{12}$ alkyl acrylate(s), preferably $C_4$-$C_{10}$ alkyl acrylate(s), preferably BA and/or EHA. In some embodiments, the acrylic polyol may contain small amounts of residues of vinyl monomers in addition to acrylic monomers.

Preferably, the acrylic polyol is made by a solution polymerization using typical initiators well known in the art. Preferably, a chain transfer agent (CTA) is used, e.g., an alcohol, glycol, glycol alkyl ether, mercapto-alcohol or mercapto-glycol; preferably an alcohol, glycol or glycol alkyl ether; preferably an alcohol. In some embodiments, the chain transfer agent is substantially free (i.e., less than 0.3%, alternatively less than 0.1%, alternatively less than 0.05%) of sulfur and the acrylic polyol is substantially free (i.e., less than 100 ppm, alternatively less than 50 ppm, alternatively less than 25 ppm) of sulfur. Suitable solvents for the polymerization include, e.g., alcohols, alkyl esters, glycols, glycol alkyl ethers, aldehydes, ketones and ethers. In some embodiments, the solvent also acts as the chain transfer agent; preferred solvents which are also chain transfer agents include, e.g., $C_1$-$C_6$ alcohols, including isopropanol. When hydroxy compounds are used as chain transfer agents, a terminal hydroxy group is believed to be attached directly to the end of the polymer chain. When alcohols, e.g., isopropanol, are used as chain transfer agents, the resulting tertiary terminal hydroxy group is believed to be chemically less reactive than hydroxy groups on hydroxyalkyl (meth)acrylates and other hydroxy-substituted monomers.

A polyisocyanate is a material having an average isocyanate functionality of at least 2. Examples of suitable polyisocyanates include those based on isophorone diisocyanate (IPDI), hexamethylene diisocyanate (HDI), dicyclohexyl methane diisocyanate (HMDI), bis(isocyanatomethyl)cyclohexane, diphenyl methane diisocyanate (MDI), toluene diisocyanate (TDI), isomers thereof or mixtures thereof. In some embodiments of the invention, the polyisocyanate is an aliphatic polyisocyanate. Prepolymers of a polyisocyanate and a polyol may also be used in this invention as the polyisocyanate component; preferred Mn for a polyisocyanate prepolymer is from 300 to 3000, preferably from 500 to 2000. In some embodiments of the invention, the functionality of the polyisocyanate is at least 2.5, alternatively at least 2.7, alternatively at least 3. In some embodiments, the polyisocyanate has functionality no greater than 5, preferably no greater than 4, preferably no greater than 3.

Preferably, the molar ratio of non-terminal hydroxy groups/NCO groups varies from 0.75:1 to 1:0.75, alternatively from 0.75:1 to 1:0.9, alternatively from 0.9:1 to 1:0.75, alternatively from 0.9:1 to 1:0.9, alternatively from 0.95:1 to 1:0.9, alternatively from 0.9:1 to 1:0.95, alternatively from 0.95:1 to 1:0.95, alternatively 0.98:1 to 1:0.98, alternatively 0.99:1 to 1:0.99, alternatively 0.995:1 to 1:0.995.

Crosslinkers are monomers having two or more ethylenically unsaturated groups, and may include, e.g., divinylaromatic compounds, di-, tri- and tetra-(meth)acrylate esters, di-, tri-and tetra-allyl ether or ester compounds and allyl (meth) acrylate. Preferred examples of such monomers include divinylbenzene (DVB), trimethylolpropane diallyl ether, tetraallyl pentaerythritol, triallyl pentaerythritol, diallyl pentaerythritol, diallyl phthalate, diallyl maleate, triallyl cyanurate, Bisphenol A diallyl ether, allyl sucroses, methylene bisacrylamide, trimethylolpropane triacrylate, allyl methacrylate (ALMA), ethylene glycol dimethacrylate (EGDMA), hexane-1,6-diol diacrylate (HDDA) and butylene glycol dimethacrylate (BGDMA). In some embodiments of the invention, the amount of polymerized crosslinker residue in the polymer is no more than 0.2%, preferably no more than 0.1%, preferably no more than 0.05%, preferably no more than 0.02%.

The composition of the present invention optionally may include other ingredients. For example, the composition may include catalyst for the urethane forming reaction, e.g., dialkyl tin diesters; adhesion promoters; antioxidants and light stabilizers. The aforementioned ingredients preferably would be in the polyol component, although some may be included in the polyisocyanate component if they are not reactive with isocyanate groups and do not catalyze isocyanate polymerization. In some embodiments of the invention, the composition contains no more than 1.5 wt % light stabilizer(s), alternatively no more than 1.25%, alternatively no more than 1%, alternatively no more than 0.75%, alternatively no more than 0.5%, alternatively no more than 0.25%.

In a photovoltaic module made according to the method of the invention, a glass sheet covers the solar cells to form a photovoltaic module in which light passes through the glass sheet before striking the solar cells. The solar cells are formed directly on the glass sheet (e.g., by sputtering or CVD) and then covered with a layer of the encapsulant material. In some embodiments of the invention, the photovoltaic module further comprises a sheet of material laminated onto the liquid encapsulant. This optional layer of material below the layer(s) of encapsulant may be rigid or flexible. The rigid material may be, e.g., glass, a synthetic polymer (e.g., polyvinyl fluoride, polyethylene terephthalate, ethylene vinyl acetate), a metal sheet, etc. In these descriptions, the term "top" indicates the direction from which light travels to reach the solar cells. In some embodiments of the invention, the encapsulant is applied to a sheet of material, followed by contacting the encapsulant layer on the sheet with the glass sheet bearing the solar cells. In most cases, the photovoltaic module requires an insulating material below the solar cells. This material may be the encapsulant or a rigid material, provided that the material meets criteria for insulating ability, e.g., test methods specified in IEC 61215, IEC 61646, UL 746A, UL746B, UL 746C.

In some embodiments of the invention, the polyol component and the isocyanate component are mixed to form the liquid encapsulant just prior to contact with the solar cells, e.g., in an in-line mixer or in a mixing tank. Depending on the type of construction of the photovoltaic module, as described above, the mixed components could be applied to glass or a synthetic polymer material prior to adding the solar cells, prior to and after the solar cells to form two layers of encapsulant material, to solar cells formed on glass or a synthetic polymer, etc. Preferably, the liquid encapsulant is cured by heating the assembled photovoltaic module, preferably to a temperature from 60° C. to 150° C. for a time from 1 minute to 3 hours. Times and temperatures will vary depending on the types of isocyanate and hydroxy functionality, hydroxy/isocyanate ratio and other factors, as is well understood in this field.

EXAMPLES

Typical Polymerization Procedure:

Isopropanol (1137 g) was charged to a 4-neck, round-bottom flask fitted with nitrogen purge, reflux condenser, temperature controller, and mechanical stirrer, and heated to 82° C. A solution of t-amyl peroxypivalate in isopropanol was added (704 mL, 4.7 wt %), followed by a mixture of 2-ethylhexyl acrylate (187 g) and hydroxyethyl methacrylate (33 g). The temperature of the mixture increased to 86° C. without added heat. After allowing the mixture to cool to 82° C., a mixture of 2-ethylhexyl acrylate (1683 g) and hydroxyethyl methacrylate (297 g) was gradually added over a period of 180 minutes. Concurrently, a solution of t-amyl peroxypivalate in isopropanol (704 mL, 4.7 wt %) was added over a period of 200 minutes. After complete addition, the mixture was maintained at 82° C. for 60 minutes, followed by addition of a solution of t-amyl peroxypivalate in isopropanol (16.6 mL, 29.8 wt %). After 15 minutes, another solution of t-amyl peroxypivalate in isopropanol (16.6 mL, 29.8 wt %) was added over period of 90 minutes. The solvent was removed from the polymer by evaporation.

The following table lists polymers made according to this method.

| Composition | CTA | solv. | Eq. wt. (g/mol)-no eg | Mw | Mn | OH# | OH/chain (no eg) |
|---|---|---|---|---|---|---|---|
| 94 BA/6 HEMA | MMP (4.0%) | EAc | 2169 | 5.8 | 2.2 | 25.9 | 1.0 |
| 95 BA/5 HEMA | ME (2.0%) | EAc | 2602.8 | 7.7 | 2.6 | 21.6 | 1.0 |
| 95 BA/5 HEMA | ME (4.0%) | EAc | 2602.8 | 4.0 | 1.7 | 21.6 | 0.7 |
| 94 BA/6 HEMA | ME (1.0%) | EAc | 2169 | 16.3 | 9.4 | 25.9 | 4.3 |
| 94 BA/6 HEMA | ME (1.5%) | EAc | 2169 | 11.2 | 6.8 | 25.9 | 3.1 |
| 94 BA/6 HEMA | MMP (1.5%) | EAc | 2169 | 20.7 | 11.5 | 25.9 | 5.3 |
| 88 BA/12 HEMA | 1-thioglycerol (3.0%) | EAc | 1084.5 | 8.7 | 5.6 | 51.7 | 5.2 |
| 88 BA/12 HEMA | 2-mercapto-3-butanol (3.0%) | EAc | 1084.5 | 9.1 | 5.8 | 51.7 | 5.3 |
| 92 BA/8 HEMA | MMP (1.75%) | EAc | 1626.8 | 17.0 | 9.4 | 34.5 | 5.8 |
| 94 BA/6 HEMA | MMP (0.5%) | EAc | 2169 | 50.6 | 23.3 | 25.9 | 10.7 |
| 94 BA/6 HEMA | — | EAc | 2169 | 194.0 | 63.5 | 25.9 | 29.3 |
| 94 BA/6 HEMA | MMP (1.0%) | EAc | 2169 | 27.0 | 14.0 | 25.9 | 6.5 |
| 91.3 EHA/8.7 HEMA | MMP (3.0%) | EAc | 1495.9 | 6.9 | 3.3 | 37.5 | 2.2 |
| 91.3 EHA/8.7 HEMA | MMP (1.5%) | EAc | 1495.9 | 16.2 | 9.1 | 37.5 | 6.1 |
| 95.8 EHA/4.2 HEMA | MMP (0.5%) | EAc | 3098.6 | 33.2 | 15.0 | 18.1 | 4.8 |
| 76 EHA/24 HEMA | MMP (0.5%) | EAc | 542 | 39.7 | 17.2 | 103.5 | 31.7 |
| 97.8 EHA/2.2 HEMA | MMP (0.5%) | EAc | 6000 | 23.5 | 11.1 | 9.4 | 1.9 |
| 80 EHA/20 HEMA | MMP (0.5%) | EAc | 651 | 38.6 | 17.0 | 86.2 | 26.1 |
| 85 EHA/15 HEMA | MMP (0.5%) | EAc | 868 | 37.1 | 16.3 | 64.6 | 18.8 |
| 91.3 EHA/8.7 HEMA | MMP (1.5%) | EAc | 1496 | 14.0 | 6.0 | 37.5 | 4.0 |
| 76 EHA/24 HEMA | MMP (3.0%) | EAc | 542 | 7.6 | 5.2 | 103.5 | 9.6 |
| 80 EHA/20 HEMA | MMP (3.0%) | EAc | 651 | 7.8 | 4.1 | 86.2 | 6.3 |
| 70 EHA/30 HPMA | MMP (3.0%) | EAc | 481 | 11.1 | 6.2 | 116.7 | 12.9 |
| 76 EHA/24 HPMA | MMP (3.0%) | EAc | 601 | 11.1 | 4.5 | 93.4 | 7.5 |
| 88 BA/12 HEMA | IPA | IPA | 1085 | 15.0 | 5.9 | 51.7 | 5.4 |
| 80 EHA/20 HPMA | MMP (3.0%) | EAc | 721 | 9.2 | 4.3 | 77.8 | 6.0 |
| 85 EHA/15 HEMA | MMP (3.0%) | EAc | 868 | 7.6 | 4.0 | 64.6 | 4.6 |
| 88 BA/12 HEMA | MMP (3.0%) | EAc | 1085 | 9.3 | 4.4 | 51.7 | 4.1 |
| 80 EHA/20 HEMA | IPA | IPA | 651 | 16.6 | 6.3 | 86.2 | 9.7 |
| 88 EHA/12 HEMA | IPA | IPA | 1085 | 12.2 | 4.7 | 51.7 | 4.3 |
| 90 EHA/10 HEMA | IPA | IPA | 1301 | 11.9 | 4.7 | 43.1 | 3.6 |
| 85 EHA/15 HEMA | MMP (3.0%) | IPA | 868 | 4.9 | 2.5 | 64.6 | 2.9 |
| 85 EHA/15 HEMA | MMP (1.5%) | EAc | 868 | 9.4 | 3.1 | 64.6 | 3.6 |
| 85 EHA/15 HEMA | IPA | IPA | 868 | 9.4 | 4.5 | 64.6 | 5.2 |
| 80 EHA/20 HPMA | IPA | IPA | 721 | 13.9 | 4.4 | 77.8 | 6.1 |
| 88 EHA/12 HPMA | IPA | IPA | 1201 | 10.9 | 3.6 | 46.7 | 3.0 |
| 100 EHA | IPA | IPA | — | 6.8 | 3.4 | — | — |

Mw and Mn listed in kg/mol;
eg = polymer end group
EAc = ethyl acetate;
MMP = methyl 3-mercaptopropionate;
IPA = isopropanol;
ME = mercaptoethanol Procedure for encapsulation of a superstrate-based thin film module.

An EHA/HEMA 85/15 copolymer as described above is crosslinked with a stoichiometric amount of HMDI (1:1 hydroxy/isocyanate molar ratio, based on hydroxy functionality of polyol excluding hydroxy end group). The copolymer (50 g, OH# 64.5 mg KOH/g), catalyst (dibutyltin diacetate, 0.005 wt %, 0.0025 g), and optional photostabilizer are mixed under vacuum at 60° C. until no bubbles are observed. Dicyclohexylmethane-4,4'-diisocyanate (a total of 7.62 g) is separately degassed. The first mixture containing the EHA/HEMA polymer and the isocyanate are pumped separately at a stoichiometric ratio into an in-line static mixer with 24 mixing elements. This mixture is coated onto a piece of backsheet (EVA/PET/Tedlar, Krempel Akasol PTL 3 HR 1000V) using a lab scale patch coater (Frontier Industrial Technology, Towanda, Pa.). The wet backsheet is then applied, using a rubber roller, to the rear surface of a glass panel on which has been fabricated an amorphous silicon solar module. The laid-up thin film module is then framed with an aluminum frame and cured in an oven for 30 minutes at 150° C.

The invention claimed is:

1. A method for producing a photovoltaic module; said method comprising steps of: (a) forming solar cells on a glass plate; and (b) contacting at least one layer of liquid encapsulant with said solar cells; wherein the liquid encapsulant comprises: (i) an acrylic polyol having an average number of hydroxy-functional monomer units per polymer chain from 2 to 25, Mn from 1,000 to 10,000, Tg from −100° C. to −40° C. and comprising from 65 to 95 wt % polymerized residues of $C_4$-$C_{12}$ alkyl (meth)acrylate and 5 to 35 wt % polymerized residues of hydroxy-containing acrylic monomer; and (ii) a polyisocyanate with an average functionality of at least two; wherein a molar ratio of non-terminal hydroxy groups in the polyol to isocyanate groups in the polyisocyanate is from 0.5:1 to 1:0.5.

2. The method of claim 1 in which the acrylic polyol has an average number of hydroxy-functional monomer units per polymer chain from 3 to 6.

3. The method of claim 2 in which the acrylic polyol has Mn from 3,000 to 5,000 and from 10 to 20% residues of hydroxy-containing acrylic monomer.

4. The method of claim 3 in which the hydroxy-containing acrylic monomer is a hydroxyalkyl (meth)acrylate.

5. The method of claim 4 in which the hydroxy-containing acrylic monomer is hydroxyethyl methacrylate, hydroxypropyl methacrylate or a combination thereof.

6. The method of claim 5 in which in which the aliphatic polyisocyanate has an average functionality from 2 to 4.

7. The method of claim 1 in which the acrylic polyol has Mn from 3,000 to 7,000.

8. The method of claim 1 in which the polyisocyanate has an average functionality from 2 to 4.

* * * * *